United States Patent [19]

Caliboso et al.

[11] Patent Number: 5,576,628
[45] Date of Patent: Nov. 19, 1996

[54] METHOD AND APPARATUS TO MEASURE CAPACITANCE

[75] Inventors: Amado A. Caliboso, Sunnyvale; S. Fred Dabney, Jr., Saratoga, both of Calif.

[73] Assignee: Telcom Semiconductor, Inc., Mountain View, Calif.

[21] Appl. No.: 316,598

[22] Filed: Sep. 30, 1994

[51] Int. Cl.$^6$ .................................................. G01R 27/26
[52] U.S. Cl. ..................... 324/678; 324/677; 324/679; 324/115; 341/150
[58] Field of Search .................................. 324/677, 678, 324/679, 115, 116, 99 D, 120; 341/128, 150, 156, 166

[56] References Cited

U.S. PATENT DOCUMENTS

| | | | |
|---|---|---|---|
| 3,581,196 | 5/1971 | Spaid | 324/678 |
| 3,612,997 | 10/1971 | Paulkovich | 324/678 |
| 3,824,459 | 7/1974 | Uchida | 324/679 X |
| 4,558,274 | 12/1985 | Carusillo | 324/678 X |
| 4,716,361 | 12/1987 | Sheffer | 324/60 R |
| 5,073,757 | 12/1991 | George | 324/677 |
| 5,136,251 | 8/1992 | George et al. | 324/678 |
| 5,329,239 | 7/1994 | Kindermann et al. | 324/679 X |

Primary Examiner—Kenneth A. Wieder
Assistant Examiner—Diep Do
Attorney, Agent, or Firm—Skjerven, Morrill, MacPherson, Franklin & Friel; David E. Steuber; Paul J. Winters

[57] ABSTRACT

A capacitance measuring device incorporates the integrating analog-digital converter circuit of a handheld meter. The capacitance measuring device charges an unknown capacitance with a constant current until the voltage across the unknown capacitor reaches a predetermined voltage. At the same time, a reference voltage is applied to the input lead of an integrating circuit of the integrating analog-digital converter such that a corresponding proportional charge is stored in the feedback capacitor of the integrating circuit. The negative of the reference voltage is then applied to the integrating circuit so that charge is removed from the feedback capacitor at the same rate as the feedback capacitor was charged. A counter is used to determine the number of clock pulses it took to completely discharge the feedback capacitor and hence a reading of the unknown capacitance can be determined from the equation $C_X = I_{CHARGE} * T_2 / V_{TRIP}$.

21 Claims, 4 Drawing Sheets

METHOD AND APPARATUS TO MEASURE CAPACITANCE

FIELD OF THE INVENTION

This invention relates to circuits that measure capacitance, and more particularly, to circuits for use in handheld meters that measure capacitance.

BACKGROUND INFORMATION

Capacitance values have conventionally been measured using methods that employ instruments that are bulky, complicated and expensive. Examples are capacitance bridges, impedance meters, oscillator circuits, and other precision instruments, which are typically stand-alone "benchtop" instruments.

Most users, however, prefer to have an instrument that is portable, self-powered, lightweight, inexpensive, and simple to operate. For example, handheld meters that measure electrical properties such as resistance, voltage, and current are available. Such meters are portable, self-powered, lightweight, inexpensive, simple to use and, hence, very popular. It is desirable to have a method and apparatus for measuring capacitance that can be inexpensively incorporated in handheld meters.

FIG. 1 (Prior Art) shows a schematic diagram of an integrating circuit used in the analog-digital converter of a typical handheld meter. This integrating circuit can be incorporated into a capacitance measuring device in accordance with the present invention. Integrating circuit 100 includes an amplifier 110, a $R_{INT}$ resistor 120, and a $C_{INT}$ capacitor 130 (sometimes referred to as the feedback capacitor). The output signal of integrating circuit 100 is well known to be given by the equation:

$$\text{Vout}(t) = -1/(R_{INT} \cdot C_{INT}) \int_0^t \text{Vin}(\tau)d\tau + V_{in}(0)$$

where Vout(t) is the voltage at an output terminal 140 as a function of voltage Vin(t) applied to an input terminal 150. Vin(0) is the initial voltage across $C_{INT}$ capacitor 130.

SUMMARY

According to one embodiment of the present invention, a capacitance measuring device incorporates the integrating analog-digital converter circuit of a handheld meter. The capacitance measuring device includes a current source which charges an unknown capacitance with a known constant current $I_{CHARGE}$ until the voltage across the unknown capacitor reaches a predetermined voltage threshold.

At substantially the same time that the unknown capacitor begins charging, a reference voltage is applied as the input signal to the integrating circuit of the integrating analog-digital converter so that the feedback capacitor of the integrating circuit begins charging at substantially the same time.

A comparator is used to detect when the voltage across the unknown capacitance reaches the voltage threshold. At this point, a control and timing logic receives the output of the comparator and controls the current source to stop charging the unknown capacitance. The control and timing logic also causes the input lead of the integrating circuit to be coupled to a source of ground potential so that the feedback capacitor of the integrating circuit no longer accumulates charge.

The control and timing logic then causes the negative of the reference voltage to be supplied to the integrating circuit's input so that charge is removed from the feedback capacitor of the integrating circuit at the same rate as the feedback capacitor was charged. At substantially the same time, a switch is closed to short circuit the terminals of the unknown capacitance so as to completely discharge it. A counter is used to determine the number of clock pulses needed to completely discharge the feedback capacitor, and the counter's output can be used to determine the value of the unknown capacitance.

In another embodiment of the present invention, a scalable current source is used to charge the unknown capacitor. The scalable current source is implemented using the reference resistors employed for resistor measurement and, thus, does not require extensive additional components. With a scalable current source, the capacitance measuring device can measure a wide range of capacitance.

Thus, a device according to the present invention adds the much needed function of capacitance measuring to a handheld meter with a minimal increase in cost, weight and size by using the integrating analog-digital converter circuit already present in a typical handheld meter.

DETAILED DESCRIPTION OF THE INVENTION

Figure 1:
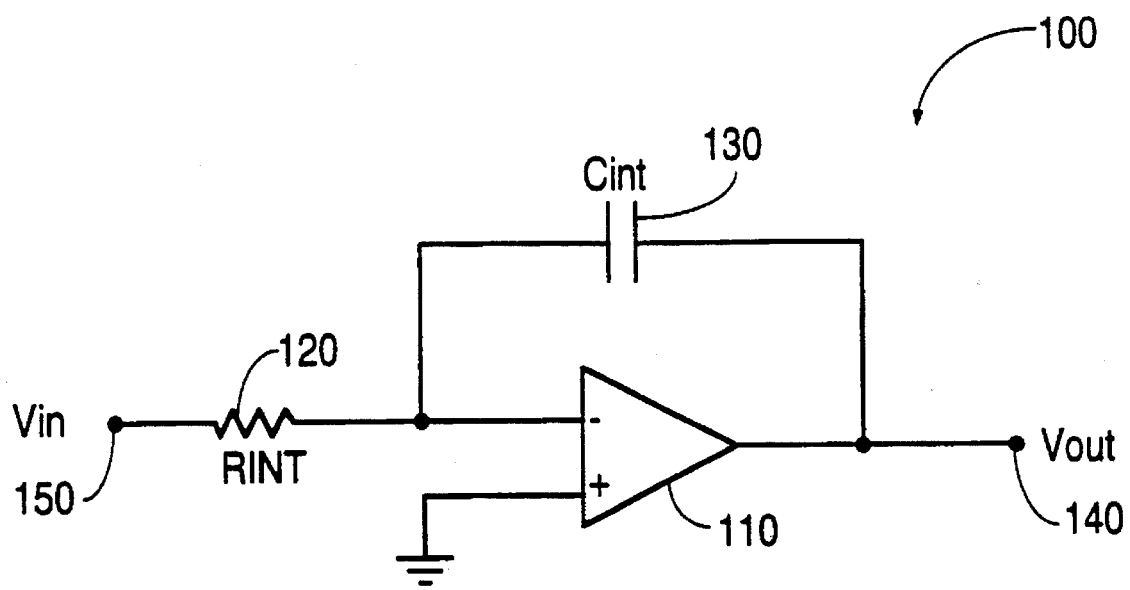
FIG. 1 (Prior Art) shows a schematic diagram of an integrating circuit used in the analog-digital converter of a typical handheld meter.
Figure 2:
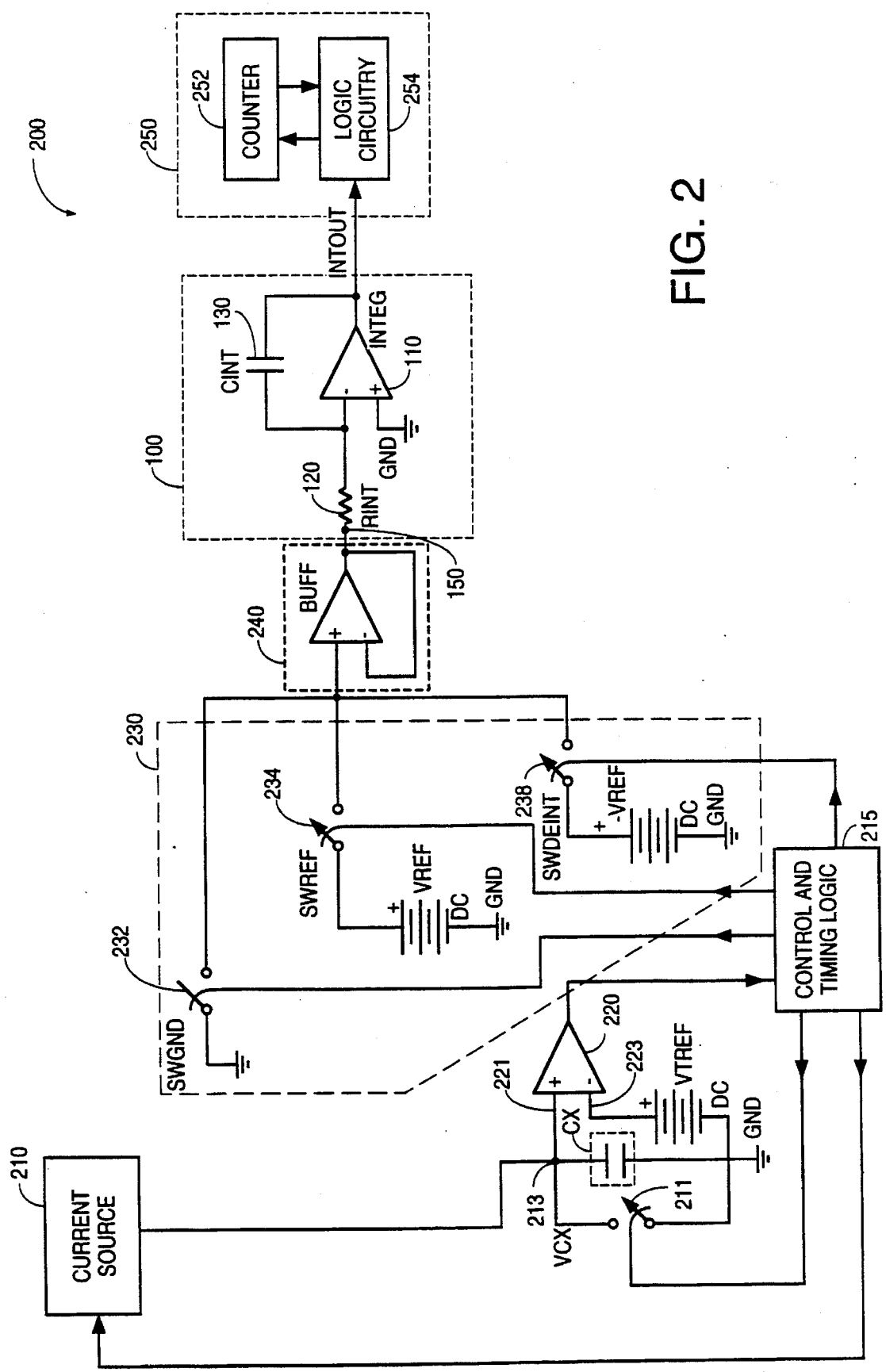
FIG. 2 shows a schematic diagram of a capacitance measuring device according to one embodiment of the present invention, incorporating the integrating circuit of FIG. 1.

FIG. 2 shows a schematic diagram of a capacitance measuring device according to one embodiment of the present invention, incorporating the integrating circuit of FIG. 1. In a preferred embodiment, capacitance measuring device 200 incorporates integrating circuit 100 already present in a handheld meter. It is appreciated that capacitance measuring device 200 can be incorporated into any type of measuring device and is not limited to handheld meters. Capacitance measuring device 200 operates in charge/integrate, zero-input-integrate, and discharge/deintegrate cycles.

In the charge/integrate cycle, a current source 210 is used to charge unknown capacitance $C_X$. Before charging, a control and timing logic 215 closes a switch 211, thereby discharging unknown capacitance $C_X$. Thus, the voltage at a node 213 is substantially 0 volts. After unknown capacitance $C_X$ is discharged, control and timing logic 215 opens switch 211 and the charging cycle begins.

Current source 210 provides a predetermined constant current $I_{CHARGE}$ to node 213 to charge the unknown capacitance at a substantially constant rate. Thus, capacitance $C_X$ is charged more linearly than by using a resistive pullup coupled to a constant voltage source. A comparator 220 coupled to node 213 has a very high input impedance and, thus, conducts substantially no current from node 213. The voltage $V_{CX}$ at node 213 is detected by comparator 220 at a positive input lead 221 and compared to a voltage $V_{TRIP}$ impressed at a negative input lead 223 of comparator 220. The output signal of comparator 220 is received by control and timing logic 215.

While unknown capacitance $C_X$ is charging and the voltage at node 213 remains below voltage $V_{TRIP}$ comparator 220 outputs a logic zero signal. In response to this logic zero signal, control and timing logic 215 closes a switch 234 in switch network 230, thereby causing a voltage $V_{REF}$ to be applied at a positive input lead 242 of buffer 240. Control and timing logic 215 also controls a switch 238 to be opened.

In response to voltage $V_{REF}$, buffer 240 generates a voltage substantially equal to voltage $V_{REF}$, which is applied to input terminal 150 of integrating circuit 100. As a result, a substantially constant current equal to $V_{REF}/R_{INT}$ begins to charge $C_{INT}$ capacitor 130. Consequently, $C_{INT}$ capacitor 130 begins charging at substantially the same time as unknown capacitance $C_X$ begins charging.

The zero-input-integrate cycle begins when voltage $V_{CX}$ at node 213 rises above voltage $V_{TRIP}$. As a result, comparator 220 outputs a logic one signal, which causes control and timing logic 215 to open switch 234 and close switch 232. The closing of switch 232 grounds input lead 242 of buffer 240. Buffer 240 then also outputs a 0 V signal, which causes input terminal 150 to be at 0 V, thereby stopping the charging (or discharging) of $C_{INT}$ capacitor 130. At substantially the same time, control and timing logic 215 controls current source 210 to stop charging unknown capacitance $C_X$. Thus, $C_{INT}$ capacitor 130 is charged for substantially the same amount of time that unknown capacitance $C_X$ is charged.

At this point, the charge $Q_X$ stored in the unknown capacitance $C_X$ is computed using the equation:

$$Q_X = C_X^* \cdot V_{TRIP} \quad (1)$$

where $C_X^*$ is the value of unknown capacitance $C_X$.

The charge stored in the unknown capacitance can also be computed using the equation:

$$Q_X = I_{CHARGE} \cdot T_1 \quad (2)$$

where $T_1$ is the time it takes for the voltage at node VCX to ramp up from 0 V to voltage $V_{TRIP}$. Combining equations (1) and (2) results in:

$$C_X^* = I_{CHARGE} \cdot T_1 / V_{TRIP} \quad (3)$$

Because $C_{INT}$ capacitor 130 is charged for substantially the same time as the capacitance $C_X$, the charge $Q_{INT}$ stored in the $C_{INT}$ capacitor 130 can be calculated from the equation:

$$Q_{INT} = (V_{REF}/R_{INT}) \cdot T_1 \quad (4)$$

At the beginning of the discharge/deintegrate cycle, control and timing logic 215 opens switch 232 and closes switch 238. Switch 234 remains opened. Because a voltage $-V_{REF}$ is applied to input terminal 150 of integrating circuit 100, $C_{INT}$ capacitor 130 is discharged at the same rate it was charged and, thus, the time $T_2$ to completely discharge $C_{INT}$ capacitor 130 is substantially equal to the charging time $T_1$.

By employing the digital circuitry 250 used in the handheld meter's integrating analog-digital converter, a counter 252 can be used to determined the number of clock cycles needed to completely discharge $C_{INT}$ capacitor 130. Thus:

$$C_X^* = I_{CHARGE} \cdot T_2 / V_{TRIP} \quad (5)$$

By adjusting $I_{CHARGE}$ and $V_{TRIP}$, the counter output provides the input to a logic circuit 254 to compute the value $C_X^*$ of unknown capacitance $C_X$. The computed value $C_X^*$ of unknown capacitance $C_X$ may then be shown on a display. Thus, capacitance measuring device 200 can easily be adapted to measure either $T_1$ or $T_2$ to compute the value $C_X^*$ of capacitance $C_X$.

Figure 3A:
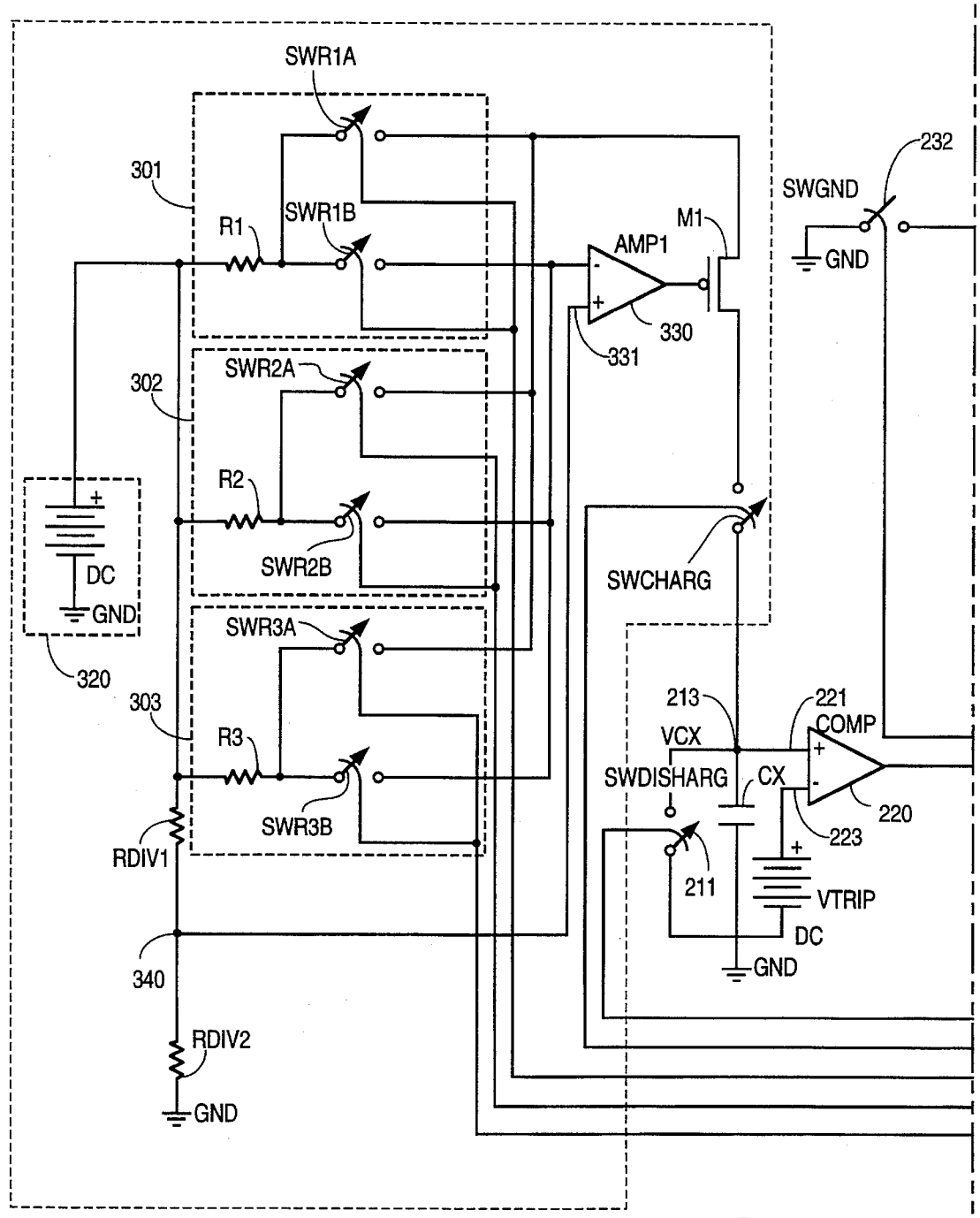
FIGS. 3a and 3b show a schematic diagram of a capacitance measurement device according to another embodiment of the present invention.
Figure 3B:
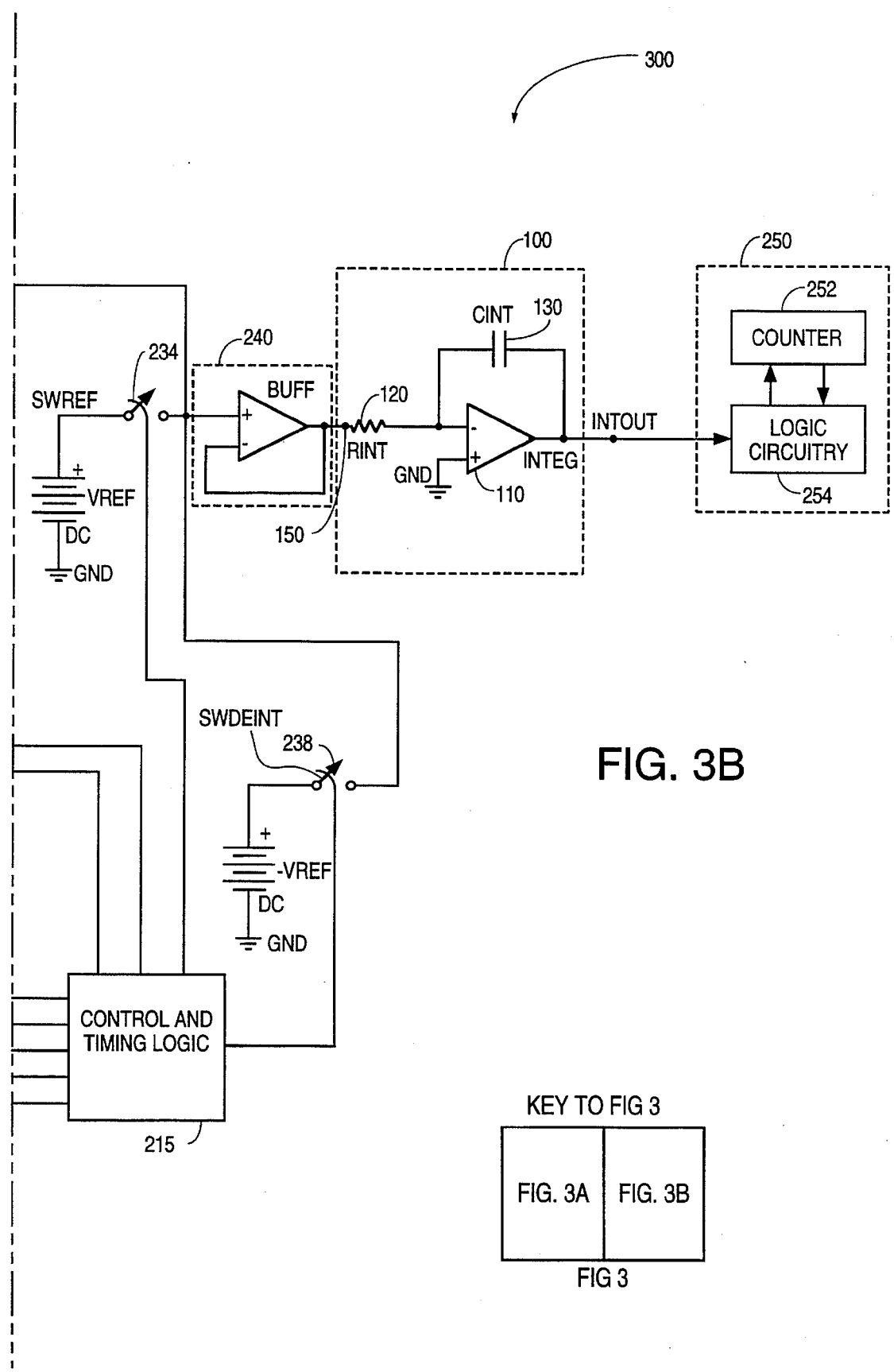

FIG. 3 shows a schematic diagram of a capacitance measurement device according to another embodiment of the present invention. Capacitance measuring device 300 is similar to capacitance measuring device 200 (FIG. 2) except that a scalable constant current source 310 replaces current source 210.

Scalable current source 310 includes resistor/switch groups 301–303, each group having a resistor and two FET switches. When a switch group is selected, the two switches in the resistor/switch group are both closed. Conversely, when a resistor/switch group is not selected, both switches are open. Preferably, only one resistor/switch group is selected during a charge/integrate cycle.

The operation of resistor/switch group 301 is described below. It is understood that this description also applies to resistor/switch groups 302 and 303.

When resistor/switch group 301 is selected during a charge/integrate cycle, switches SWR1A and SWR1B and SWCHARG are closed by control and timing logic 215. The voltage divider consisting of resistors RDIV1 and RDIV2 is coupled to a voltage source 320 supplying a voltage $V_{CREF}$. As a result, a predetermined voltage drop ($V_{RDIV1}$) appears across resistor RDIV1. Because node 340 is coupled to the positive input lead 331 of amplifier 330, the voltage at input lead 331 is equal to the voltage drop across RDIV2.

Amplifier 330 operates to maintain a "virtual short circuit" across its input leads when configured with a negative feedback loop. In this embodiment, a PMOS FET M1 provides a feedback loop as follows. When the voltage across resistor R1 ($V_{R1}$) is less than voltage $V_{RDIV1}$, amplifier 330 outputs a lower voltage, which causes PMOS FET M1 to become more conductive. Consequently, more current is drawn from voltage source 320, which causes voltage $V_{R1}$ to increase.

Conversely, when voltage $V_{R1}$ is greater than voltage $V_{RDIV1}$, amplifier 330 outputs a higher voltage, which causes PMOS FET M1 to become less conductive. Thus, less current is drawn from voltage source 320, which causes voltage $V_{R1}$ to decrease. The loop stabilizes when $V_{RDIV1}$ is substantially equal to voltage $V_{R1}$. Because of the loop, voltage VRDIV1 develops across resistor R1. Thus, a constant charging current ($I_{CHARGE}$) is given by:

$$I_{CHARGE} = (V_{RDIV1})/R1^* \quad (6)$$

where R1* is the value of resistor R1. Further, voltage $V_{RDIV1}$ is given by the voltage divider equation:

$$V_{RDIV1} = V_{CREF} \left( \frac{RDIV1^*}{RDIV1^* + RDIV2^*} \right) \quad (7)$$

where RDIV1* is the value of resistor RDIV1 and RDIV2* is the value of resistor RDIV2. Combining equations (6) and (7) results in $$I_{CHARGE} = \frac{(V_{CREF} * RDIV1^*)}{R1^*(RDIV1^* + RDVI2^*)} \quad (8)$$

Current $I_{CHARGE}$ flows into unknown capacitance $C_X$ via FET M1, switch SWCHARG, and a resistor $R_P$.

By selecting resistor/switch groups 302 (or 303), switches SWR2A and SWR2B (or SWR3A and SWR3B) are closed in place of SWR1A and SWR1B. Charging current $I_{CHARGE}$ is scaled because resistor R1 is replaced by resistor R2 (or R3) in the equation above.

In a preferred embodiment, resistors R1, R2, and R3 are part of the resistor network typically present in handheld meters. The resistors in the resistor network are used as references for resistance measurement. The values of resistors R1–R3 generally are multiples of 10 of the smallest value. Thus charging current $I_{CHARGE}$ can be scaled in multiples of 10 to allow measurement of a wide range of capacitance values.

The rest of the circuitry of capacitance measuring device 300 operates in the same manner as device 200 described above in conjunction with FIG. 2.

In another embodiment (not shown), integrating circuit 100 in capacitance measuring device 300 is replaced by the integrating circuit disclosed in the contemporaneously filed application "Integrating Circuit With Variable Gain Feedback", application Ser. No. 08/316,283, by Zhong Heng Mo, which is incorporated herein by reference. With the integrating circuit described therein, it is advantageous for capacitance measuring device 300 to measure the deintegrate time $T_2$ because the integrating circuit has a X10 mode (used for other functions of the handheld meter) where the deintegrate time is measured. Thus, the capacitance measuring device, to measure time $T_2$, can simply use the circuitry for measuring the deintegrate time in the X10 mode, which is already present in the integrating circuit.

The foregoing has described the principles and preferred embodiments of the present invention. However, the invention should not be construed as being limited to the particular embodiments described. For example, more than three resistors may be used in the resistor network of scalable current source 310. Also, the switches may be implemented in bipolar or other transistor technology. Further, buffer 240 may be implemented as disclosed in the contemporaneously filed application "Switched High-Slew Rate Buffer", application Ser. No. 08/316,161, by Zhong Heng Mo, which is incorporated herein by reference. Thus, the above-described embodiments should be regarded as illustrative rather than restrictive. Variations can be made to those embodiments by workers skilled in the art without departing from the scope of the present invention as defined by the following claims.

I claim:

1. A device for measuring an unknown capacitance, comprising:

a current source having a current output lead coupled to a first electrode of said unknown capacitance, said current source capable of providing a current to charge said unknown capacitance;

a first voltage source having a voltage output lead, wherein said first voltage source is capable of supplying a first voltage at said voltage output lead;

a comparator having a first input lead, a second input lead, and an output lead, said first input lead adapted to be coupled to said first electrode of said unknown capacitance and said second input lead being coupled to said voltage output lead of said first voltage source;

a switch network having a control lead coupled to said output lead of said comparator and an analog output lead, wherein said switch network is capable of varying a voltage at said analog output lead by coupling a second voltage source to said analog output lead in response to a control signal on said control lead;

an integrating circuit having an analog input lead coupled to said analog output lead of said switch network, said integrating circuit comprising an amplifier and a feedback capacitor coupled, said amplifier having an output lead coupled to a first electrode of said feedback capacitor and an input lead coupled to a second electrode of said feedback capacitor, wherein a voltage across said feedback capacitor is varied or not varied by said integrating circuit responsive to said voltage on said analog output lead of said switch network; and a digital circuit coupled to said output lead of said integrating circuit, wherein said digital circuit measures a charging or discharging time of said feedback capacitor and calculates a value of said unknown capacitance based upon said charging or discharging time, wherein said comparator generates said control signal on said output lead of said comparator, said control signal having a first logic level when said voltage across said unknown capacitance is less than said first voltage and a second level when said voltage across said unknown capacitance is greater than said first voltage.

2. The device recited in claim 1, wherein said control signal, when at said first logic level, causes said switch network to couple said second voltage source to said analog output lead, said second voltage source supplying a second voltage to charge said feedback capacitor, and said control signal, when at said second logic level, causes said switch network to couple a third voltage source to said analog output lead to stop charging said feedback capacitor.

3. The device in claim 2, said digital circuit further comprising a counter, coupled to said output lead of said integrating circuit, for measuring the time needed to charge or discharge said feedback capacitor.

4. The device in claim 3, said digital circuit further comprising logic circuitry, coupled to said counter, for determining the value of said unknown capacitance.

5. The device in claim 1, wherein said integrating circuit is incorporated in a measuring device for measuring electrical properties in addition to capacitance.

6. The device recited in claim 5, wherein said measuring device is a handheld meter.

7. The device recited in claim 6, wherein said current source comprises a scalable current source.

8. The device recited in claim 7, wherein said current source further comprises resistive voltage divider network.

9. The device recited in claim 1, wherein said switch network further comprises a first switch controlled by a voltage on said control lead to couple or not couple a source of ground potential to said analog output lead.

10. The device recited in claim 1, wherein said switch network further comprises a second switch controlled by a voltage on said control lead to couple or not couple a second voltage source to said analog output lead, said analog output lead receiving a second voltage supplied by said second voltage source.

11. The device recited in claim 1, wherein said switch network further comprises a third switch, said third switch coupling a third voltage source to said analog output lead, said third voltage source supplying a voltage substantially equal to the negative of the voltage supplied by said second voltage source.

12. The device recited in claim 1, further comprising a buffer coupled between said analog output lead and said input lead of said integrating circuit.

13. A method for measuring an unknown capacitance using an integrating circuit having a feedback capacitor, said method comprising the steps of:

charging said unknown capacitance;

charging said feedback capacitor beginning at substantially the same time as said charging of said unknown capacitance;

comparing a voltage across said unknown capacitance to a voltage threshold and providing a control signal indicative of when said voltage across said unknown capacitance is charged to be substantially equal to said voltage threshold;

terminating the charging of said feedback capacitor when said control signal indicates that said voltage across said unknown capacitance is substantially equal to said voltage threshold;

discharging said feedback capacitor;

measuring the time necessary to substantially discharge said feedback capacitor; and determining the value of said unknown capacitance from said measured time.

14. The method of claim 13, wherein said integrating circuit is incorporated in a handheld meter.

15. The method of claim 13, wherein the step of charging said feedback capacitor beginning at substantially the same time as said charging of said unknown capacitance further comprises the steps of generating a charging voltage and coupling said charging voltage to said feedback capacitor, and wherein said step of discharging said feedback capacitor at substantially the same rate as said unknown capacitance was charged further comprises the steps of generating a discharging voltage having an equal magnitude but opposite polarity as said charging voltage and coupling said discharging voltage to said feedback capacitor.

16. A device for measuring an unknown capacitance using an integrating circuit having a feedback capacitor, said device comprising:

means for charging said unknown capacitance;

means for charging said feedback capacitor beginning at substantially the same time as said charging of said unknown capacitance;

means for comparing a voltage across said unknown capacitance to a voltage threshold and providing a control signal indicative of when said voltage across said unknown capacitance is charged to be substantially equal to said voltage threshold;

means for terminating the charging of said feedback capacitor when said control signal indicates that said voltage across said unknown capacitance is substantially equal to said voltage threshold;

means for discharging said feedback capacitor;

means for measuring the time necessary to substantially discharge said feedback capacitor; and means for determining the value of said unknown capacitance from said measured time.

17. The device recited in claim 16, wherein said integrating circuit is an integrating circuit incorporated in a handheld meter.

18. A device for measuring an unknown capacitance using an integrating circuit having a feedback capacitor, said device comprising:

means for charging said unknown capacitance, wherein said means for charging said unknown capacitance comprises a scalable current source;

means for charging said feedback capacitor beginning at substantially the same time as said charging of said unknown capacitance;

means for comparing a voltage across said unknown capacitance to a voltage threshold;

means for terminating the charging of said feedback capacitor when said voltage across said unknown capacitance is substantially equal to said voltage threshold;

means for discharging said feedback capacitor;

means for measuring the time necessary to substantially discharge said feedback capacitor; and means for determining the value of said unknown capacitance from said measured time.

19. The device recited in claim 18, wherein said scalable current source further comprises a resistor network incorporated in said handheld meter.

20. A circuit comprising:

a current source having a current output lead, wherein said current is capable of providing a current for charging an unknown capacitance coupled to said current output lead;

a first voltage source having a voltage output lead, wherein said first voltage source is capable of providing a first voltage at said voltage output lead;

a comparator having a first input lead, a second input lead and an output lead, wherein:
said first input lead is coupled to said voltage output lead of said first voltage source,
said second input lead is capable of being coupled to said unknown capacitance, and
said comparator is capable of comparing a voltage across said unknown capacitance to said first voltage and outputting a control signal on said output lead of said comparator responsive to said comparison of said voltage across said unknown capacitance and said first voltage;

a switch network having a control lead and an analog output lead, said control lead being coupled to said output lead of said comparator, wherein said switch network is capable of coupling said analog output lead to a second voltage source in response to said control signal outputted by said comparator; and an integrating circuit having an analog input lead and an output lead, said integrating circuit comprising:
an amplifier having an input lead coupled to said input lead of said integrating circuit and an output lead coupled to said output lead of said integrating circuit, and
a feedback capacitor coupled between said input lead of said amplifier and said output lead of said amplifier, said output lead coupled to said feedback capacitor, wherein said feedback capacitor is not charged responsive to said control signal.

21. A method for measuring an unknown capacitance using an integrating circuit having a feedback capacitor, said method comprising the steps of:

charging said unknown capacitance;

charging said feedback capacitor beginning at substantially the same time as said charging of said unknown capacitance;

comparing a voltage across said unknown capacitance to a voltage threshold;

terminating said charging of said feedback capacitor when said voltage across said unknown capacitance is substantially equal to said voltage threshold;

measuring the time necessary to substantially charge said feedback capacitor; and determining the value of said unknown capacitance from said measured time.

* * * * *